(12) United States Patent
Cho et al.

(10) Patent No.: US 10,304,871 B2
(45) Date of Patent: May 28, 2019

(54) DISPLAY PANEL AND MANUFACTURING METHOD THEREOF

(71) Applicants: HKC Corporation Limited, Shenzhen (CN); Chongqing HKC Optoelectronics Technology Co., ltd., Chongqing (CN)

(72) Inventors: En-Tsung Cho, Chongqing (CN); Kun Fan, Chongqing (CN); Yiqun Tian, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/869,160

(22) Filed: Jan. 12, 2018

(65) Prior Publication Data

US 2018/0190682 A1    Jul. 5, 2018

Related U.S. Application Data

(63) Continuation of application No. PCT/CN2017/084128, filed on May 12, 2017.

(30) Foreign Application Priority Data

Dec. 30, 2016  (CN) .......................... 2016 1 1261789

(51) Int. Cl.
*H01L 27/00* (2006.01)
*G02F 1/1333* (2006.01)
(Continued)

(52) U.S. Cl.
CPC ........ *H01L 27/1248* (2013.01); *G02F 1/1368* (2013.01); *G02F 1/133345* (2013.01);
(Continued)

(58) Field of Classification Search
CPC ............. G02F 1/133345; G02F 1/1368; G02F 2202/103; G02F 1/136213;
(Continued)

(56) References Cited

U.S. PATENT DOCUMENTS 6,479,391 B2 * 11/2002 Morrow ............ H01L 21/31144
257/E21.257
8,330,880 B2 * 12/2012 Lin .......................... H01J 9/24
349/12

(Continued)

OTHER PUBLICATIONS

Rath et al., "Organic amine-functionalized silica-based mesoporous materials: an update of syntheses and catalytic applications", 2014, RSC Adv., 2014, 4, 57111-57124 (Sep. 11, 2014).*

*Primary Examiner* — Nikolay K Yushin
(74) *Attorney, Agent, or Firm* — WPAT, PC

(57) ABSTRACT

A display panel and a manufacturing method are provided. The display panel includes a substrate, multiple active switches disposed on the substrate and a low dielectric constant protective layer. The low dielectric constant protective layer is formed on the numerous active switches. A relative dielectric constant of the low dielectric constant protective layer is smaller than a relative dielectric constant of silicon nitride.

16 Claims, 5 Drawing Sheets

(51) Int. Cl.
*H01L 27/12* (2006.01)
*G02F 1/1368* (2006.01)
*H01L 29/786* (2006.01)

(52) U.S. Cl.
CPC ...... *H01L 27/1259* (2013.01); *H01L 27/1262* (2013.01); *H01L 27/1288* (2013.01); *H01L 29/78669* (2013.01); *G02F 2201/50* (2013.01); *G02F 2202/103* (2013.01); *G02F 2202/42* (2013.01)

(58) Field of Classification Search
CPC ......... G02F 1/134363; G02F 1/136277; H01L 27/1262; H01L 27/1288; H01L 27/1248; H01L 29/78669; H01L 28/40; H01L 29/78606; H01L 29/4908
See application file for complete search history.

(56) References Cited

U.S. PATENT DOCUMENTS

| | | | |
|---|---|---|---|
| 8,349,630 B1* | 1/2013 | Hsu | H01L 27/1288 257/E21.536 |
| 2011/0216256 A1* | 9/2011 | Lin | G02F 1/135 349/27 |

* cited by examiner

DISPLAY PANEL AND MANUFACTURING METHOD THEREOF

FIELD OF THE DISCLOSURE

The disclosure relates to the field of display technology, and more particularly to a display panel and a manufacturing method thereof.

BACKGROUND

Displays are widely applied due to numerous advantages such as thin bodies, energy saving, radiation-free, etc. Most displays available on the market are backlight-type displays, and such display includes a display panel and a backlight module. The working principle of the display panel is placing liquid crystal molecules between two parallel substrates, and applying a driving voltage on the two substrates to control rotation directions of the liquid crystal molecules, for refracting rays of the backlight module to generate images.

A thin film transistor-liquid crystal display (TFT-LCD) gradually occupies the dominant position in the display realm at present because of its properties such as low energy consumption, superior image quality and relatively high production yield, etc. Identically, the TFT-LCD includes a display panel and a backlight module. The liquid crystal panel includes a color filter (CF) substrate and a thin film transistor (TFT) substrate. The opposite internal sides of the substrates have transparent electrodes. A layer of liquid crystal (LC) molecules are interposed between the two substrates. The display panel alters the polarization state of light by control of the electric field on the orientation of liquid crystal molecules, and achieves the objective of display by blocking or unblocking the optical path by a polarizer.

The production of TFT devices with high performance is the basis of the quality LCD. The protective layer of the TFT commonly employs silicon nitride. The protective layer has a relatively small relative dielectric constant, but the relative dielectric constant of silicon nitride is relatively high, and the capacitance is large. Signals can be easily disturbed.

SUMMARY

The disclosure provides a display panel. A relative dielectric constant of a protective layer on active switches is low.

Furthermore, the disclosure further provides a manufacturing method adopting the display panel.

The objective of the disclosure is achieved by following embodiments.

A display panel includes a substrate, multiple active switches disposed on the substrate, and a low dielectric constant protective layer.

The low dielectric constant protective layer is formed on the numerous active switches. A relative dielectric constant of the low dielectric constant protective layer is smaller than a relative dielectric constant of silicon nitride.

The low dielectric constant protective layer includes the mesoporous silica.

The relative dielectric constant of the mesoporous silica is εr=1.4~2.4. The low dielectric constant protective layer adopts the mesoporous silica instead of the material SiNx for a protective layer in a TFT device with a process of 5-mask and 4-mask. The relative dielectric constant of SiNx is $ε_r$=7~8. εr of the mesoporous silica is lower than εr of silicon oxide. The relative dielectric constant of silicon oxide is εr=3.9~4.1. The performance of the TFT device can be improved. The problems of signal disturbance and the RC circuit delay can be prevented. The thickness of the low dielectric constant protective layer can be reduced. The low dielectric constant protective layer can employ other materials with a low dielectric constant as well, such as nanoporous silicon and so on.

The mesoporous silica includes numerous hollow columnar sub-components connected with each other. A cross section of the sub-component is hexagonal, and a middle of the sub-component has a circular through hole.

Sizes of the through holes of the sub-components are the same. The cross section of the sub-component is hexagonal for the convenience of assembling the numerous sub-components.

The mesoporous silica includes a number of sub-elements. The sub-elements include the sub-components arranged in three lines. An intermediate line of the sub-elements includes the three sub-components arranged abreast. A first line and a third line of the sub-element each include the two sub-components arranged abreast. The two sub-components of the first line and the two-components of the third line respectively are disposed between any two sub-components of the three sub-components in the intermediate line.

The sub-elements have the orderly arranged sub-components with the relatively high specific surface area, thermal stability and hydrothermal stability.

A number of first-layer wires are disposed on the substrate. An insulating dielectric layer is disposed on the first-layer wires. An amorphous silicon layer is disposed on the insulating dielectric layer and corresponding to a gate wire section of the first-layer wires. An ohmic contact layer is disposed on and corresponding to the amorphous silicon layer. A source wire section and a drain wire section are separated from each other and disposed on the ohmic contact layer. A groove is defined between the source wire section and the drain wire section. The groove penetrates through the ohmic contact layer. A bottom of the groove is the amorphous silicon layer. A width of the source wire section and the drain wire section as a whole is larger than a width of the amorphous silicon layer. The low dielectric constant protective layer is disposed on the source wire section and the drain wire section. A pixel electrode layer is disposed on the low dielectric constant protective layer.

The low dielectric constant protective layer is defined with a via hole corresponding to the drain wire section. The pixel electrode layer and the drain wire section are connected by the via hole.

An active switch with the better performance such as a thin film transistor (TFT) can be obtained.

A side of a portion of the source wire section beyond the amorphous silicon layer is immediately connected with the insulating dielectric layer and an opposite side of the portion of the source wire section is immediately connected with the low dielectric constant protective layer. A section of the insulating dielectric layer corresponding to the via hole is connected with the drain wire section.

5 mask is utilized to obtain the active switch such as the TFT.

A number of first-layer wires are disposed on the substrate. An insulating dielectric layer is disposed on the first-layer wires. An amorphous silicon layer is disposed on the insulating dielectric layer and corresponding to a gate wire section of the first-layer wires. An ohmic contact layer is disposed on and corresponding to the amorphous silicon layer. A source wire section and a drain wire section are separated from each other and disposed on the ohmic contact layer. A groove is defined between the source wire section and the drain wire section. The groove penetrates through the ohmic contact layer. A bottom of the groove is the amorphous silicon layer. Widths of the source wire section and the drain wire section respectively are equal to widths of portions of the ohmic contact layer contacted therewith. The low dielectric constant protective layer is disposed on the source wire section and the drain wire section. A pixel electrode layer is disposed on the low dielectric constant protective layer. The low dielectric constant protective layer is disposed with a pixel electrode layer. The low dielectric constant protective layer is defined with a via hole correspondingly to the drain wire section. The pixel electrode layer and the drain wire section are connected by the via hole.

An active switch with the better performance such as a thin film transistor (TFT) can be obtained.

The low dielectric constant protective layer located outside the source wire section is immediately connected with the insulating dielectric layer. The amorphous silicon layer, the ohmic contact layer and the drain wire section are disposed on the insulating dielectric layer in sequence correspondingly to the via hole.

The active switch such as the TFT can be obtained by 4 mask processes.

According to another aspect of the disclosure, the disclosure further discloses a manufacturing method of a display panel, including steps of: arranging a number of active switches on a substrate, and forming a low dielectric constant protective layer with a relative dielectric constant lower than a relative dielectric constant of silicon nitride on the numerous active switches.

A protective layer of SiNx with a relative dielectric constant εr=7~8 on the active switches is replaced by the low dielectric constant protective layer. εr of the low dielectric constant protective layer is lower than εr of silicon oxide. The relative dielectric constant of silicon oxide is εr=3.9~4.1. The performance of the TFT device can be improved by using the low dielectric constant protective layer as the protective layer on the active switch such as the thin film transistor (TFT). The problems of signal disturbance and the RC circuit delay can be prevented.

Forming the low dielectric constant protective layer with a relative dielectric constant lower than a relative dielectric constant of silicon nitride on the numerous active switches includes forming micellar rods from micells; arranging the micellar rods as a hexagon to be a hexagonal micellar rod array; forming a silica-template mesophase from the hexagonal micellar rod array according to an organic molecular template self-assembly mechanism; calcining the silica-template mesophase to remove a template and thereby form the mesoporous silica; and forming the low dielectric constant protective layer by the mesoporous silica.

The relative dielectric constant of the mesoporous silica is εr=1.4~2.4. The low dielectric constant protective layer adopts the mesoporous silica instead of the material SiNx for a protective layer in a TFT device with a process of 5-mask and 4-mask. The relative dielectric constant of SiNx is $\varepsilon_r$=7~8. εr of the mesoporous silica is lower than εr of silicon oxide. The relative dielectric constant of silicon oxide is εr=3.9~4.1. The performance of the TFT device can be improved. The problems of signal disturbance and the RC circuit delay can be prevented. The thickness of the low dielectric constant protective layer can be reduced.

The protective layer of SiNx with a relative dielectric constant $\varepsilon_r$=7~8 on the active switches is replaced by the low dielectric constant protective layer. The relative dielectric constant of the low dielectric constant protective layer is lower than the relative dielectric constant of silicon oxide. The relative dielectric constant of silicon oxide is εr=3.9~4.1. The performance of the active switches can be improved by using the low dielectric constant protective layer as the protective layer. The problems of signal disturbance and the RC circuit delay can be prevented.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
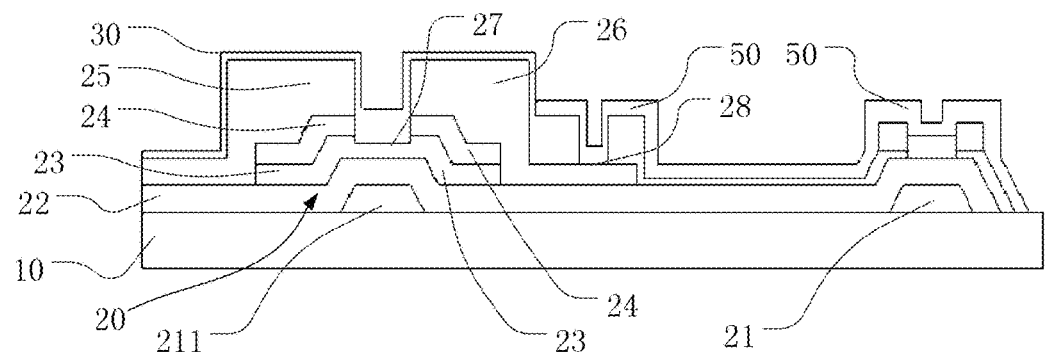
FIG. 1 is a structural schematic view of a 5 mask inverted staggered TFT device according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, it should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "contain" and/or "include" define the existence of described features, integers, steps, operations, units and/or components, but do not exclude the existence or addition of one or more other features, integers, steps, operations, units, components and/or combinations thereof.

The disclosure will be further described with reference to accompanying drawings and preferred embodiments as follows.

A display panel and a manufacturing method of embodiments of the disclosure will be illustrated with reference to FIG. 1 through FIG. 11 as follows.

As shown in FIG. 1, the display panel in the embodiment of FIG. 1 includes a substrate 10, numerous active switches 20 (only one active switch is shown in FIG. 1 for purpose of illustration) disposed on the substrate 10, and a protective layer 30 formed on the numerous active switches 20. The protective layer 30 adopts silicon nitride. The substrate 10 is disposed with a number of first-layer wires 21. The numerous first-layer wires 21 are disposed with an insulating dielectric layer 22. The insulating dielectric layer 22 is disposed with an amorphous silicon layer 23 corresponding to a gate wire section 211 of the first-layer wires 21. The amorphous silicon layer 23 is disposed with an ohmic contact layer 24 corresponding to the amorphous silicon layer 23. The ohmic contact layer 24 is disposed with a source wire section 25 and a drain wire section 26; the source wire section 25 and the drain wire section 26 are separated. A groove 27 is defined between the source wire section 25 and the drain wire section 26. The groove 27 penetrates through the ohmic contact layer 24. A bottom of the groove 27 is the amorphous silicon layer 23. A width of the source wire section 25 and the drain wire section 26 as a whole is larger than a width of the amorphous silicon layer 23. The source wire section 25 and the drain wire section 26 are disposed with the protective layer 30. The protective layer 30 is disposed with a pixel electrode layer 50. The protective layer 30 is defined with a via hole 28 correspondingly to the drain wire section 26. The pixel electrode layer 50 and the drain wire section 26 are connected by the via hole 28. A side of a portion of the source wire section 25 beyond the amorphous silicon layer 23 is immediately connected with the insulating dielectric layer 22 and an opposite side is immediately connected with the protective layer 30. A section of the insulating dielectric layer 22 corresponding to the via hole 28 is connected with the drain wire section 26. The active switches 20 such as the thin film transistor (TFT) obtained by utilizing 5 mask have the relatively good performance.

Figure 2:
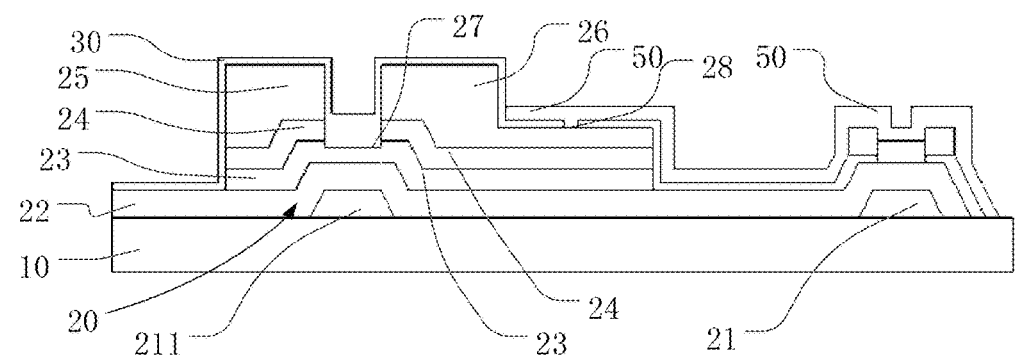
FIG. 2 is a structural schematic view of a 4 mask inverted staggered TFT device according to an embodiment of the disclosure.

As shown in FIG. 2, the display panel in the embodiment of FIG. 2 includes the substrate 10, numerous active switches 20 (only one active switch is shown in FIG. 2 for purpose of illustration) disposed on the substrate 10, and the protective layer 30 formed on the numerous active switches 20. The protective layer 30 adopts silicon nitride. The substrate 10 is disposed with a number of first-layer wires 21. The first-layer wires 21 are disposed with the insulating dielectric layer 22. The insulating dielectric layer 22 is disposed with the amorphous silicon layer 23 corresponding to the gate wire section 211 of the first-layer wires 21. The amorphous silicon layer 23 is disposed with the ohmic contact layer 24 correspondingly to the amorphous silicon layer 23. The ohmic contact layer 24 is disposed with the source wire section 25 and the drain wire section 26; the source wire section 25 and the drain wire section 26 are separated. The groove 27 is defined between the source wire section 25 and the drain wire section 26. The groove 27 penetrates through the ohmic contact layer 24. The bottom of the groove 27 is the amorphous silicon layer 23. Widths of the source wire section 25 and the drain wire section 26 respectively are equal to the widths of portions of the ohmic contact layer 24 contacted therewith. The source wire section 25 and the drain wire section 26 are disposed with the protective layer 30. The protective layer 30 is disposed with the pixel electrode layer 50. The protective layer 30 is defined with the via hole 28 correspondingly to the drain wire section 26. The pixel electrode layer 50 and the drain wire section 26 are connected by the via hole 28. The protective layer 30 located outside the source wire section 25 is immediately connected with the insulating dielectric layer 22. The amorphous silicon layer 23, the ohmic contact layer 24 and the drain wire section 26 are disposed on the insulating dielectric layer 22 in sequence correspondingly to the via hole 28. The active switches 20 such as TFTs obtained by utilizing 4 mask have the relatively good performance without the mask process.

The production of the active switches 20 such as TFTs with high performance is the basis of the quality LCD. Structures of the 5-mask and 4-mask inverted staggered TFT devices are as shown in FIG. 1 and FIG. 2. A conventional material of the protective layer of the TFT is SiNx with the relative dielectric constant $\varepsilon r=7\sim 8$, identically to a gate dielectric layer. Compared with the relatively small $\varepsilon r$ of the protective layer required by the gate dielectric layer, $\varepsilon r$ of SiNx is higher and capacitance is larger. Problems such as signal disturbance and the considerable thickness of films can be the barrier to develop panels.

Figure 3:
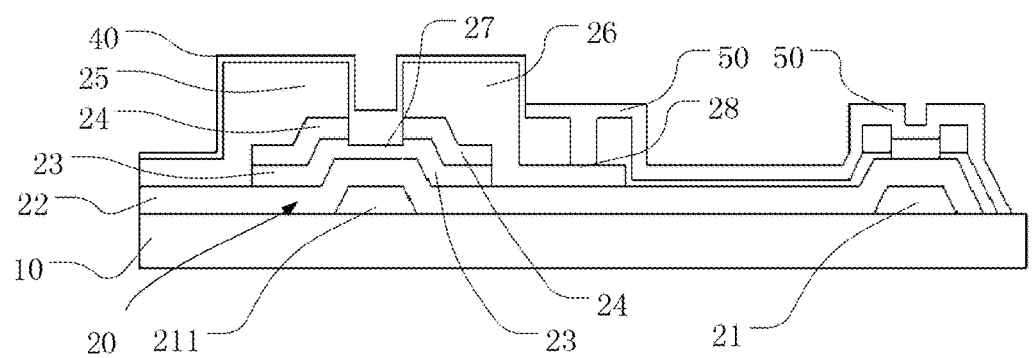
FIG. 3 is another schematic view of a 5 mask inverted staggered TFT device according to an embodiment of the disclosure.
Figure 5:
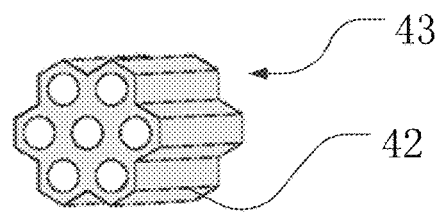
FIG. 5 is a schematic view of the mesoporous silica according to an embodiment of the disclosure.

As shown in FIG. 3 and FIG. 5, the display panel in the embodiments of FIG. 3 and FIG. 5 includes the substrate 10, numerous active switches 20 (only one active switch is shown in FIG. 3 for purpose of illustration) such as thin film transistors disposed on the substrate 10, and a low dielectric constant protective layer 40 formed on the numerous active switches 20. A relative dielectric constant of the low dielectric constant protective layer 40 is smaller than a relative dielectric constant of silicon nitride. The protective layer 30 made of SiNx with a relative dielectric constant $\varepsilon r=7\sim 8$ of the active switches 20 such as TFTs is replaced by the low dielectric constant protective layer 40. εr of the low dielectric constant protective layer 40 is lower than εr of silicon oxide. The relative dielectric constant of silicon oxide is εr=3.9~4.1. The performance of the active switches 20 such as TFTs can be improved by using the low dielectric constant protective layer 40 as the protective layer 30. The problems of signal disturbance and the RC circuit delay can be prevented.

The low dielectric constant protective layer 40 includes the mesoporous silica. The relative dielectric constant of the mesoporous silica is εr=1.4~2.4. The low dielectric constant protective layer 40 adopts the mesoporous silica instead of the material SiNx for the protective layer 30 in a TFT device with a process of 5-mask and 4-mask. The relative dielectric constant of SiNx is $ε_r$=7~8. εr of the mesoporous silica is lower than εr of silicon oxide. The relative dielectric constant of silicon oxide is εr=3.9~4.1. The performance of the TFT device can be improved. The problems of signal disturbance and the RC circuit delay can be prevented. The thickness of the low dielectric constant protective layer 40 can be reduced. The low dielectric constant protective layer 40 can employ other materials with a low dielectric constant as well, such as nanoporous silicon and so on.

The mesoporous silica includes numerous hollow columnar sub-components 42 connected with each other. A cross section of the sub-component 42 is hexagonal, and a middle of the sub-component 42 has a circular through hole. Sizes of the through holes of the sub-components 42 are the same. The cross section of the sub-component 42 is hexagonal for the convenience of assembling the numerous sub-components 42.

The mesoporous silica includes a number of sub-elements 43. The sub-elements 43 include the sub-components 42 arranged in three lines. An intermediate line of the sub-element 43 includes the three sub-components 42 arranged abreast. A first line and a third line of the sub-element 43 respectively includes the two sub-components 42 arranged abreast. The two sub-components 42 of the first line and the two-components 42 of the third line respectively are disposed between any two sub-components 42 of the three sub-components 42 in the intermediate line. In other words, each of the sub-elements 43 includes seven sub-components 42, one of which is surrounded and connected by the other six sub-components 42. The sub-elements 43 have the orderly arranged sub-components 42 with the relatively high specific surface area, thermal stability and hydrothermal stability.

The substrate 10 is disposed with a number of first-layer wires 21. The first-layer wires 21 are disposed with the insulating dielectric layer 22. The insulating dielectric layer 22 is disposed with the amorphous silicon layer 23 correspondingly to the gate wire section 211 of the first-layer wires 21. The amorphous silicon layer 23 is disposed with the ohmic contact layer 24 corresponding to the amorphous silicon layer 23. The ohmic contact layer 24 is disposed with the source wire section 25 and the drain wire section 26; the source wire section 25 and the drain wire section 26 are separated. The groove 27 is defined between the source wire section 25 and the drain wire section 26. The groove 27 penetrates through the ohmic contact layer 24. The bottom of the groove 27 is the amorphous silicon layer 23. The width of the source wire section 25 and the drain wire section 26 as a whole is larger than the width of the amorphous silicon layer 23. The source wire section 25 and the drain wire section 26 are disposed with the low dielectric constant protective layer 40. The low dielectric constant protective layer 40 is disposed with the pixel electrode layer 50. The low dielectric constant protective layer 40 is defined with the via hole 28 correspondingly to the drain wire section 26. The pixel electrode layer 50 and the drain wire section 26 are connected by the via hole 28. The side of the portion of the source wire section 25 beyond the amorphous silicon layer 23 is immediately connected with the insulating dielectric layer 22 and an opposite side is immediately connected with the low dielectric constant protective layer 40. The section of the insulating dielectric layer 22 corresponding to the via hole 28 is connected with the drain wire section 26. The active switches 20 such as the thin film transistor (TFT) obtained by utilizing 5 mask can gain the better performance.

Figure 4:
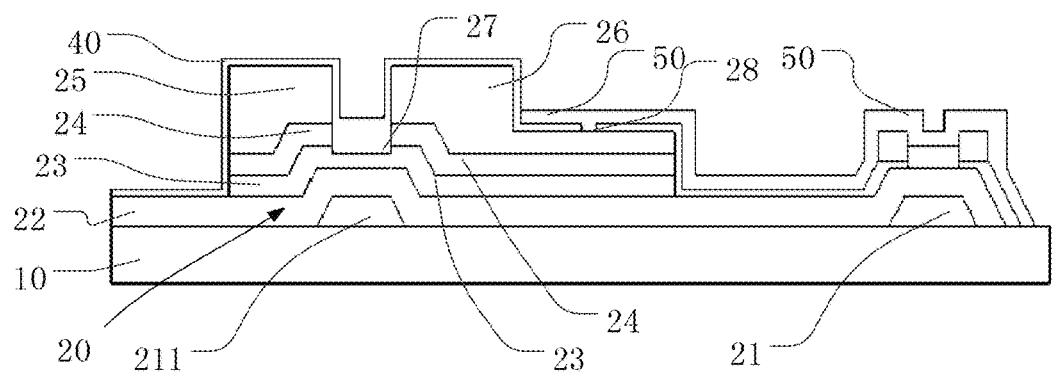
FIG. 4 is another schematic view of a 4 mask inverted staggered TFT device according to an embodiment of the disclosure.

As shown in FIG. 4 and FIG. 5, the display panel in the embodiments of FIG. 4 and FIG. 5 includes the substrate 10, numerous active switches 20 (only one active switch is shown in FIG. 5 for purpose of illustration) disposed on the substrate 10, and a low dielectric constant protective layer 40 formed on the numerous active switches 20. The relative dielectric constant of the low dielectric constant protective layer 40 is smaller than the relative dielectric constant of silicon nitride. The protective layer 30 made of SiNx with a relative dielectric constant εr=7~8 of the active switches 20 such as TFTs is replaced by the low dielectric constant protective layer 40. εr of the low dielectric constant protective layer 40 is lower than εr of silicon oxide. The relative dielectric constant of silicon oxide is εr=3.9~4.1. The performance of the active switches 20 such as TFTs can be improved by using the low dielectric constant protective layer 40 as the protective layer 30. The problems of signal disturbance and the RC circuit delay can be prevented.

The low dielectric constant protective layer 40 includes the mesoporous silica. The relative dielectric constant of the mesoporous silica is εr=1.4~2.4. The low dielectric constant protective layer 40 adopts the mesoporous silica instead of the material SiNx for the protective layer 30 in a TFT device with a process of 5-mask and 4-mask. The relative dielectric constant of SiNx is $ε_r$=7~8. εr of the mesoporous silica is lower than εr of silicon oxide. The relative dielectric constant of silicon oxide is εr=3.9~4.1. The performance of the TFT device can be improved. The problems of signal disturbance and the RC circuit delay can be prevented. The thickness of the low dielectric constant protective layer 40 can be reduced. The low dielectric constant protective layer 40 can employ other materials with a low dielectric constant as well, such as nanoporous silicon and so on.

The mesoporous silica includes numerous hollow columnar sub-components 42 connected with each other. A cross section of the sub-component 42 is hexagonal, and a middle of the sub-component 42 has a circular through hole. Sizes of the through holes of the sub-components 42 are the same. The cross section of the sub-component 42 is hexagonal for the convenience of assembling the numerous sub-components 42.

The substrate 10 is disposed with a number of first-layer wires 21. The first-layer wires 21 are disposed with the insulating dielectric layer 22. The insulating dielectric layer 22 is disposed with the amorphous silicon layer 23 correspondingly to the gate wire section 211 of the first-layer wires 21. The amorphous silicon layer 23 is disposed with the ohmic contact layer 24 corresponding to the amorphous silicon layer 23. The ohmic contact layer 24 is disposed with the source wire section 25 and the drain wire section 26; the source wire section 25 and the drain wire section 26 are separated. The groove 27 is defined between the source wire section 25 and the drain wire section 26. The groove 27 penetrates through the ohmic contact layer 24. The bottom of the groove 27 is the amorphous silicon layer 23. Widths of the source wire section 25 and the drain wire section 26 respectively are equal to the widths of portions of the ohmic contact layer 24 contacted therewith. The source wire section 25 and the drain wire section 26 are disposed with the low dielectric constant protective layer 40. The low dielectric constant protective layer 40 is disposed with the pixel electrode layer 50. The low dielectric constant protective layer 40 is defined with the via hole 28 correspondingly to the drain wire section 26. The pixel electrode layer 50 and the drain wire section 26 are connected by the via hole 28.

The low dielectric constant protective layer 40 located outside the source wire section 25 is immediately connected with the insulating dielectric layer 22. The amorphous silicon layer 23, the ohmic contact layer 24 and the drain wire section 26 are disposed on the insulating dielectric layer 22 in sequence correspondingly to the via hole 28.

The obtained active switches 20 such as TFTs can achieve the better performance without the mask process, resulting in reducing time and costs.

Figure 10:
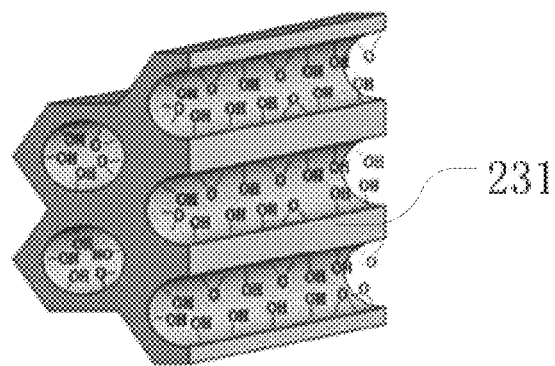
FIG. 10 is a schematic view of nanoporous silicon according to an embodiment of the disclosure.
Figure 11:
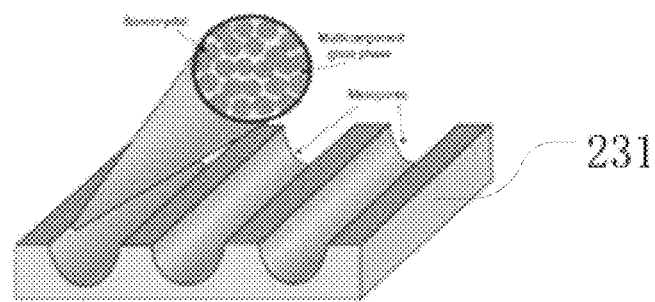
FIG. 11 is a schematic view of nanoporous silicon and germanium nanoparticles according to an embodiment of the disclosure.

As shown in FIG. 10 and FIG. 11, the dielectric constant of the insulating dielectric layer 22 is larger than the dielectric constants of the silicon oxide layer and the silicon nitride. The insulating dielectric layer 22 includes a composition. The composition includes a first component and a second component. The dielectric constant of the insulating dielectric layer 22 disposed on the first-layer wires 21 is larger than the dielectric constants of the silicon oxide layer and the silicon nitride layer to increase the ability of storing electric charges of the device. The dielectric constant of the first component is smaller than the dielectric constants of the silicon oxide layer and the silicon nitride layer. The dielectric constant of the second component is larger than the dielectric constants of the silicon oxide layer and the silicon nitride layer. The dielectric constant of the insulating dielectric layer 22 can be adjusted by controlling the ratio of the first component to the second component.

Optionally, the first component includes nanoporous silicon. The nanoporous silicon can be processed to be extremely thin. The thickness of the insulating dielectric layer can be reduced to satisfy requirements on smaller sizes of integrated circuits, chips and TFT-LCDs. The nanoporous silicon is inherently hydrophobic.

Optionally, the second component includes germanium nanoparticles. The dielectric constant of germanium is 16. The dielectric constant of the insulating dielectric layer 22 is raised by adjusting the ratio of germanium. Other materials and metal with high dielectric constants can be used as well.

Optionally, the first component includes nanoporous silicon. The second component includes germanium nanoparticle. The nanoporous silicon can be processed to be extremely thin. The thickness of the insulating dielectric layer can be reduced to satisfy requirements on smaller sizes of integrated circuits, chips and TFT-LCDs. The nanoporous silicon is inherently hydrophobic. The dielectric constant of germanium is 16. The nanoporous silicon inherently has numerous silicon holes for storing the germanium particles therein, and the thickness of the nanoporous silicon will not be increased. The dielectric constant can be controlled by adjusting the loading capacity of the germanium (Ge) particles.

The insulating dielectric layer 22 includes nanoporous silicon. The nanoporous silicon includes numerous hollow columnar sub-components 231 connected with each other. A cross section of the sub-component 231 is hexagonal, and a middle of the sub-component 231 has a circular through hole. The circular though hole of the sub-component 231 are defined with several silicon holes. The Ge nanoparticles are disposed in the silicon holes. The hexagonal cross section of the sub-component 231 of the porous silicon is convenient for assembling the multiple sub-components 231. The Ge nanoparticles in the silicon holes will not change the thickness of the porous silicon.

Figure 6:
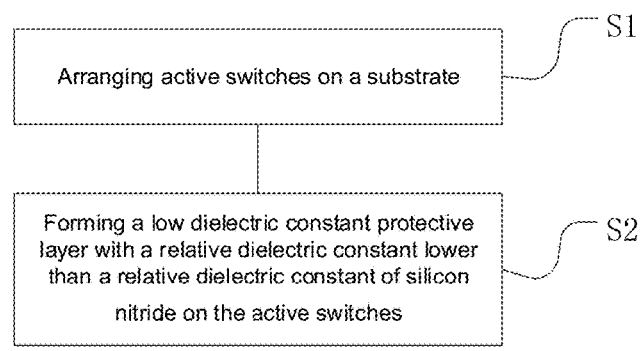
FIG. 6 is a flowchart of a process of a display panel according to an embodiment of the disclosure.

According to another aspect of the disclosure, as shown in FIG. 6, the disclosure further discloses a process of a display panel, including steps of: disposing a number of active switches on a substrate, and forming a low dielectric constant protective layer on the numerous active switches. A relative dielectric constant of the low dielectric constant protective layer is lower than a relative dielectric constant of silicon nitride.

The protective layer of SiNx with a relative dielectric constant $\epsilon r=7\sim 8$ on the active switches such as thin film transistors (TFTs) is replaced by the low dielectric constant protective layer. $\epsilon r$ of the low dielectric constant protective layer is lower than $\epsilon r$ of silicon oxide. The relative dielectric constant of silicon oxide is $\epsilon r=3.9\sim 4.1$. The performance of the active switches such as TFTs can be improved by using the low dielectric constant protective layer as the protective layer. The problems of signal disturbance and the RC circuit delay can be prevented.

Figure 7:
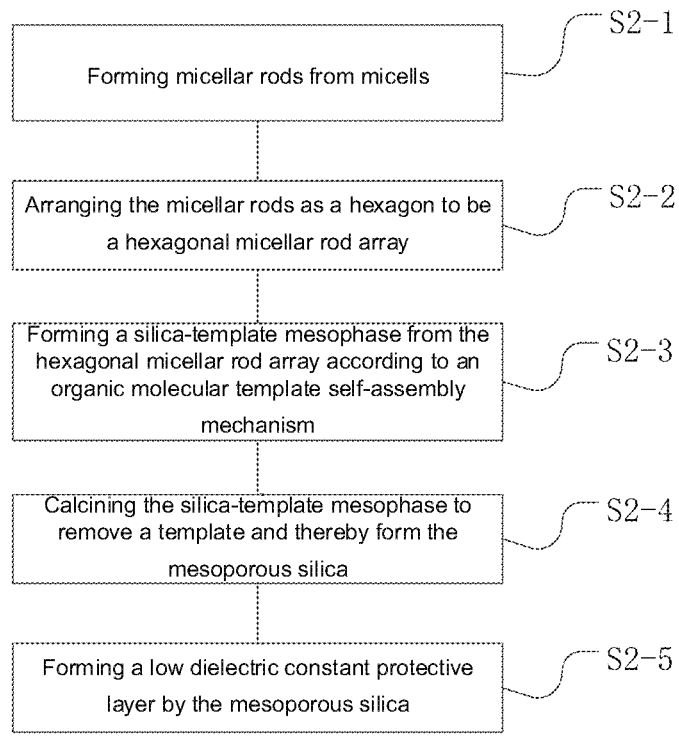
FIG. 7 is another flowchart of a process of a display panel according to an embodiment of the disclosure.
Figure 8:
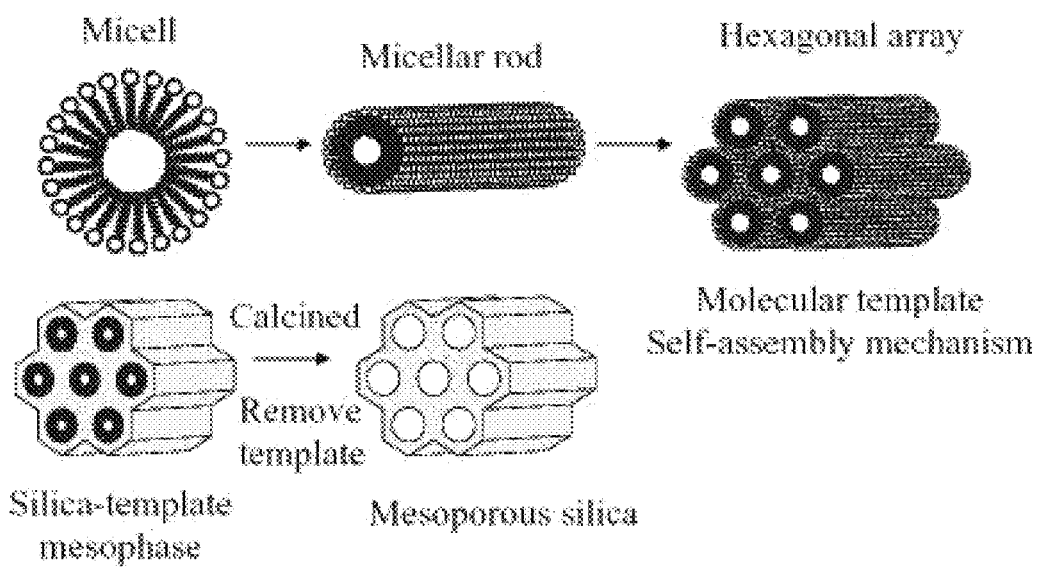
FIG. 8 is schematic view of a process of producing mesoporous silica by an organic molecular template self-assembly mechanism according to an embodiment of the disclosure.

As shown in FIG. 7 and FIG. 8, disposing the low dielectric constant protective layer on the active switches such as TFTs includes forming micellar rods by micells; arranging the micellar rods as a hexagon to be a hexagonal micellar rod array; forming a silica-template mesophase from the hexagonal micellar rod array according to an organic molecular template self-assembly mechanism; calcining the silica-template mesophase to remove a template and thereby form the mesoporous silica; and forming the low dielectric constant protective layer by the mesoporous silica.

The relative dielectric constant of the mesoporous silica is $\epsilon r=1.4\sim 2.4$. The low dielectric constant protective layer adopts the mesoporous silica instead of the material SiNx with a process of 5-mask and 4-mask active switches. The relative dielectric constant of SiNx is $\epsilon_r=7\sim 8$. $\epsilon r$ of the mesoporous silica is lower than $\epsilon r$ of silicon oxide. The relative dielectric constant of silicon oxide is $\epsilon r=3.9\sim 4.1$. The performance of the TFT device can be improved accordingly. The problems of signal disturbance and the RC circuit delay can be prevented. The thickness of the low dielectric constant protective layer can be reduced.

Figure 9:
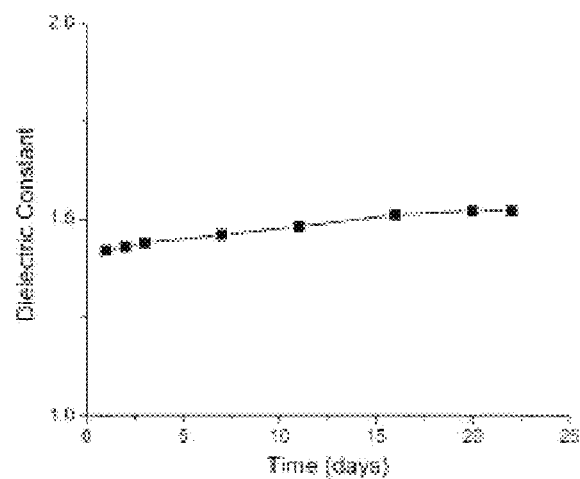
FIG. 9 is a chart of tested dielectric constants according to an embodiment of the disclosure.

As shown in FIG. 9, in the chart of tested dielectric constants of FIG. 9, the dielectric constant of mesoporous silica is relatively low and stable. The diversification is little while the time passes by.

In the embodiments above, the amorphous silicon layer uses a-Si without excluding other semiconductor materials.

In the embodiments above, the material of the substrate can be glass, plastic, etc.

In the embodiments above, the display panel includes a liquid crystal display, a plasma panel and so on. Taking the liquid crystal panel as an example, the liquid crystal panel includes an array substrate and a color filter (CF) substrate. The array substrate and the color filter substrate are disposed opposite. A photo spacer (PS) is disposed between the array substrate and the color filter substrate. The array substrate is disposed with the thin film transistor (TFT). The color filter substrate is disposed with a color filter film.

In the embodiment above, the color filter substrate can include the TFT array. The color film and the TFT array can be formed on the same substrate. The array substrate can include a color filter layer.

In the embodiment above, the display panel of the disclosure can be a curved panel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A display panel comprising:
a substrate;
a plurality of active switches, disposed on the substrate;
a low dielectric constant protective layer formed on the plurality of active switches, wherein a relative dielectric constant of the low dielectric constant protective layer is lower than a relative dielectric constant of silicon nitride;
wherein the low dielectric constant protective layer comprises a mesoporous silica; the mesoporous silica comprises a plurality of hollow columnar sub-components connected with each other, a cross section of the sub-component is hexagonal, and a middle of the sub-component has a circular through hole; the mesoporous silica comprises a plurality of sub-elements, the sub-element comprises the sub-components arranged in three lines, an intermediate line of the sub-element comprises three sub-components arranged abreast, a first line and a third line of the sub-element each comprise two sub-components arranged abreast, the two sub-components of each of the first line and the third line each are disposed between any two sub-components of the three sub-components in the intermediate line;
wherein a plurality of first-layer wires are disposed on the substrate, an insulating dielectric layer is disposed on the first-layer wires, an amorphous silicon layer is disposed on the insulating dielectric layer and corresponding to a gate wire section of the first-layer wires, an ohmic contact layer is disposed on and corresponding to the amorphous silicon layer, a source wire section and a drain wire section are separated from each other and disposed on the ohmic contact layer, a groove is defined between the source wire section and the drain wire section, the groove passes through the ohmic contact layer, a bottom of the groove is the amorphous silicon layer, a width of the source wire section and the drain wire section as a whole is larger than a width of the amorphous silicon layer, the low dielectric constant protective layer is disposed on the source wire section and the drain wire section, a pixel electrode layer is disposed on the low dielectric constant protective layer, the low dielectric constant protective layer is defined with a via hole corresponding to the drain wire section, the pixel electrode layer is connected with the drain wire section by the via hole; a side of a portion of the source wire section beyond the amorphous silicon layer is immediately connected with the insulating dielectric layer, an opposite side of the portion of the source wire section is immediately connected with the low dielectric constant protective layer, and a section of the insulating dielectric layer corresponding to the via hole is connected with the drain wire section.

2. A display panel comprising:
a substrate;
a plurality of active switches, disposed on the substrate;
a low dielectric constant protective layer, formed on the plurality of active switches, wherein a relative dielectric constant of the low dielectric constant protective layer is lower than a relative dielectric constant of silicon nitride,
wherein a plurality of first-layer wires are disposed on the substrate, an insulating dielectric layer is disposed on the first-layer wires, an amorphous silicon layer is disposed on the insulating dielectric layer and corresponding to a gate wire section of the first-layer wires, an ohmic contact layer is disposed on and corresponding to the amorphous silicon layer, a source wire section and a drain wire section are separated from each other and disposed on the ohmic contact layer, a groove is defined between the source wire section and the drain wire section, the groove penetrates through the ohmic contact layer, a bottom of the groove is the amorphous silicon layer, a width of the source wire section and the drain wire section as a whole is larger than a width of the amorphous silicon layer, the low dielectric constant protective layer is disposed on the source wire section and the drain wire section, a pixel electrode layer is disposed on the low dielectric constant protective layer, the low dielectric constant protective layer is defined with a via hole corresponding to the drain wire section, the pixel electrode layer is connected to the drain wire section by the via hole.

3. The display panel according to claim 2, wherein a side of a portion of the source wire section beyond the amorphous silicon layer is immediately connected with the insulating dielectric layer, and an opposite side of the portion of the source wire section is immediately connected with the low dielectric constant protective layer, and a section of the insulating dielectric layer corresponding to the via hole is immediately connected with the drain wire section.

4. The display panel according to claim 2, wherein the relative dielectric constant of the low dielectric constant protective layer is lower than that of silicon oxide.

5. The display panel according to claim 2, wherein a material of the low dielectric constant protective layer comprises nanoporous silicon.

6. The display panel according to claim 2, wherein a dielectric constant of the insulating dielectric layer is larger than that of silicon oxide and is larger than that of silicon nitride.

7. The display panel according to claim 2, wherein the low dielectric constant protective layer comprises a mesoporous silica.

8. The display panel according to claim 7, wherein a relative dielectric constant of the mesoporous silica is in the range of 1.4~2.4.

9. The display panel according to claim 7, wherein the mesoporous silica comprises a plurality of hollow columnar sub-components connected with each other, a cross section of the sub-component is hexagonal, and a middle of the sub-component has a circular through hole.

10. The display panel according to claim 9, wherein the mesoporous silica comprises a plurality of sub-elements, the sub-element comprises the sub-components arranged in three lines, an intermediate line of the sub-element comprises three sub-components arranged abreast, a first line and a third line of the sub-element each comprise two sub-components arranged abreast, the two sub-components of each of the first line and the third line each are disposed between any two sub-components of the three sub-components in the intermediate line.

11. The display panel according to claim 9, wherein the mesoporous silica comprises a plurality of sub-elements, each of the plurality of sub-elements comprises seven sub-components, one of which is surrounded and connected by the other six sub-components.

12. A manufacturing method of a display panel, comprising steps of:

arranging a plurality of active switches on a substrate; and forming a low dielectric constant protective layer with a relative dielectric constant lower than a relative dielectric constant of silicon nitride on the plurality of active switches;

wherein in the step of arranging a plurality of active switches on a substrate, a plurality of first-layer wires are disposed on the substrate, an insulating dielectric layer is disposed on the plurality of first-layer wires, an amorphous silicon layer is disposed on the insulating dielectric layer and corresponding to a gate wire section of the first-layer wires, an ohmic contact layer is disposed on and corresponding to the amorphous silicon layer, a source wire section and a drain wire section are separated from each other and disposed on the ohmic contact layer, a groove is defined between the source wire section and the drain wire section, the groove penetrates through the ohmic contact layer, a bottom of the groove is the amorphous silicon layer, a width of the source wire section and the drain wire section as a whole is larger than a width of the amorphous silicon layer, the low dielectric constant protective layer is disposed on the source wire section and the drain wire section, a pixel electrode layer is disposed on the low dielectric constant protective layer, the low dielectric constant protective layer is defined with a via hole corresponding to the drain wire section, the pixel electrode layer is connected to the drain wire section by the via hole.

13. The manufacturing method of a display panel according to claim 12, wherein in the step of arranging a plurality of active switches on a substrate, a side of a portion of the source wire section beyond the amorphous silicon layer is immediately connected with the insulating dielectric layer, an opposite side of the portion of the source wire section is immediately connected with the low dielectric constant protective layer, and a section of the insulating dielectric layer corresponding to the via hole is connected with the drain wire section.

14. The manufacturing method of a display panel according to claim 12, wherein forming a low dielectric constant protective layer with a relative dielectric constant lower than a relative dielectric constant of silicon nitride comprises:

forming micellar rods from micells;

arranging the micellar rods as a hexagon to be a hexagonal micellar rod array;

forming a silica-template mesophase from the hexagonal micellar rod array according to an organic molecular template self-assembly mechanism;

calcining the silica-template mesophase to remove a template and thereby form a mesoporous silica;

forming the low dielectric constant protective layer by the mesoporous silica.

15. The manufacturing method of a display panel according to claim 14, wherein the mesoporous silica comprises a plurality of hollow columnar sub-components connected with each other, a cross section of the sub-component is hexagonal, and a middle of the sub-component has a circular through hole.

16. The manufacturing method of a display panel according to claim 15, wherein the mesoporous silica comprises a plurality of sub-elements, the sub-element comprises the sub-components arranged in three lines, an intermediate line of the sub-element comprises three sub-components arranged abreast, a first line and a third line of the sub-elements each comprise two sub-components arranged abreast, the two sub-components of each of the first line and the third line each are disposed between any two sub-components of the three sub-components in the intermediate line.

* * * * *